(12) United States Patent
Ikemoto et al.

(10) Patent No.: US 6,424,032 B1
(45) Date of Patent: Jul. 23, 2002

(54) SEMICONDUCTOR DEVICE HAVING A POWER SUPPLY RING AND A GROUND RING

(75) Inventors: Yoshihiko Ikemoto; Mitsuo Abe; Yoshitsugu Katoh; Sumikazu Hosoyamada, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/643,911

(22) Filed: Aug. 23, 2000

(30) Foreign Application Priority Data

Dec. 7, 1999 (JP) .......................................... 11-348146

(51) Int. Cl.$^7$ .............................................. H01L 23/52
(52) U.S. Cl. ....................................... 257/691; 257/692
(58) Field of Search ................................. 257/691, 666, 257/676, 692

(56) References Cited

U.S. PATENT DOCUMENTS

| | | | | |
|---|---|---|---|---|
| 5,343,074 A | * | 8/1994 | Higgin et al. | |
| 5,483,099 A | * | 1/1996 | Natarajan et al. | |
| 5,801,440 A | * | 9/1998 | Chu et al. | |
| 5,814,877 A | * | 9/1998 | Diffenderfer | |
| 5,903,050 A | * | 5/1999 | Thurairajaratnam et al. | |
| 5,977,626 A | * | 11/1999 | Wang et al. | |
| 6,034,427 A | * | 3/2000 | Lan et al. | |
| 6,137,168 A | * | 10/2000 | Kirkman | |
| 6,194,786 B1 | * | 2/2001 | Orcutt | |
| 6,252,307 B1 | * | 6/2001 | Appelt et al. | |

* cited by examiner

*Primary Examiner*—Sheila V. Clark
(74) *Attorney, Agent, or Firm*—Armstrong, Westerman & Hattori, LLP

(57) ABSTRACT

In a semiconductor device, an influence of the simultaneous switching noise is reduced by increasing the decoupling capacity between a ground ring and a power supply ring. A semiconductor element having a plurality of electrode pads is mounted on a redistribution substrate. The power supply ring and the ground ring are formed on the redistribution substrate in a surrounding area of the semiconductor element. One of the ground ring and the power supply ring has a plurality of convex portions protruding toward the other of the ground ring and the power supply ring. The other of the ground ring and the power supply ring has a plurality of concave portions each of which receives the corresponding one of the convex portions with a predetermined distance therebetween.

4 Claims, 9 Drawing Sheets

SEMICONDUCTOR DEVICE HAVING A POWER SUPPLY RING AND A GROUND RING

BACKGROUND OF THE INVENTION

1. Field of the Invention

The present invention relates to semiconductor devices and, more particularly, to a semiconductor device having a power supply ring and a grounding ring surrounding a semiconductor element.

In recent years, integration of semiconductor devices has been advanced, and the number of electrodes of semiconductor devices has been increased. Accordingly, a demand for reducing a switching noise has been increased, the switching noise being generated when a lot of signals supplied to a semiconductor device are turned on or off at the same time. Such a switching noise is referred to as a simultaneous switching noise. When an electric coupling of the power supply ring and the ground ring is strong, the influence by the simultaneous switching noise becomes large.

2. Description of the Related Art

FIG. 1 is a plan view of a power supply ring and a ground ring of a conventional semiconductor device. In FIG.1, the semiconductor element 1 is provided on an interposer 6 (redistribution layer). A ground ring 2 is formed on the interposer 6 so as to surround the semiconductor element 1. A power supply ring 3 is formed in surroundings of the grounding ring 2. A plurality of bonding pads 4 are formed outside of the power supply ring 3.

Some of the electrode pads 1a of the semiconductor element 1 is electrically connected to the respective bonding pads 4 formed on the interposer 6 by bonding wires 5. Some other electrode pads 1a of the semiconductor element 1 are connected to the ground ring 2 by the bonding wire 5 so as to be grounded. In addition, some other electrode pads 1a of the semiconductor element 1 are connected to the power supply ring 3 by the bonding wires 5 so that an electric power is supplied from the power supply ring to the semiconductor element 1.

FIG. 2 is a plan view of a part of the semiconductor device shown in FIG. 1. Each of the bonding pads 4 is connected to the respective one of the electrode pads 1a by the respective one of the bonding wires 5 (metal wire) as shown in FIG. 2. Similarly, some electrode pads 1a of the semiconductor element 1 are connected to the power supply ring 3 by the respective bonding wires 5. Some other electrode pads 1a of the semiconductor element 1 are connected to the ground ring 2 by the respective bonding wires 5 so as to be grounded.

A voltage of 3V is supplied to the power supply ring 3, for instance, and, thereby, the power supply voltage (3V) is supplied to the electrode pads 1a connected to the power supply ring 3. Additionally, the ground ring 2 is connected to a grounding line, and, thereby, the electrode pads 1a connected to the ground ring 2 are grounded.

In the above-mentioned semiconductor device, the electrode pads 1a are arranged along the four sides of the semiconductor element 1. Each of the ground ring 2 and the power supply ring 3 is configured to be in a square shaped belt so as to encircle the semiconductor element 1 with an irregular space provided therebetween.

In the above-mentioned structure, the ground ring 2 is grounded, and a constant power supply voltage is supplied to the power supply ring 3. Therefore, there is a voltage difference between the ground ring 2 and the power supply ring 3, and the capacitive coupling is provided between the ground ring 2 and the power supply ring 3. Such a capacitive coupling is referred to as a decoupling capacity in general, and indicates a magnitude of the electric coupling between the grounding ring 2 and the power supply ring 3.

High integration and speed-up of the semiconductor devices result in an increase in the number of I/O of semiconductor devices and the frequencies, which causes a problem relates to a noise such as a simultaneous switching noise, a reflection noise or an external noise. Especially, when an electric coupling between the ground potential and the power supply potential is weak, the influence of the above-mentioned noise is greatly increased. A fluctuation in the potential of the ground ring 2 and the power supply ring 3 is caused by the above-mentioned simultaneous switching noise, the reflection noise or the external exogenous noise. The fluctuation in the potential of the ground ring 2 is referred to as a ground bounce, and the fluctuation in the potential of the power supply ring 3 is refereed to as a power supply bounce. When the above-mentioned simultaneous switching noise, the reflection noise and the exogenous noise become large, the power supply bounce and the ground bounce also become large which causes a malfunction of the semiconductor device.

Moreover, the distance between each of the electrode pads 1a and the grounding ring 2 of the semiconductor element 1 is reduced when the size of the semiconductor device is reduced. Similarly, the distance between each of the electrode pads 1a and the power supply ring 3 is reduced, and the distance between the electrode pads 1a and the bonding pads 4 is reduced. In the conventional semiconductor device, as shown in FIG. 2, the bonding wires 5 are provided between the electrode pads 1a of the semiconductor element 1 and each of the ground ring 2, the power supply ring 3 and the bonding pads 4. That is, the bonding wires 5 extend from electrode pads 1a to different three positions. In the above-mentioned structure in which the bonding wires 5 extend between different connection points, there may be a case in which one of the bonding wires 5 come in contact with the adjacent one of the bonding wires 5. Thus, it is necessary to provide a certain distance between different connection points. However, a sufficient distance cannot be provided between the connection pints due to the reduction in the size of the semiconductor device.

Additionally, the number of the bonding pads 4 connected to the electrode pad 1a increases as the number of the electrode pads 1a of the semiconductor element 1 increases. Therefore, the distance between the adjacent bonding pads 4 is reduced, which causes an increase in the cross-talk noise (electromagnetic induction noise) generated between the adjacent bonding pads 4. Especially, a large cross-talk noise is generated at the connection points of the bonding wires 5, which causes a malfunction of the semiconductor device due to the cross-talk noise.

SUMMARY OF THE INVENTION

It is a general object of the present invention to provide an improved and useful semiconductor device in which the above-mentioned problems are eliminated.

A more specific object of the present invention is to provide a semiconductor device in which the influence of the simultaneous switching noise is reduced by increasing the decoupling capacity between the ground ring and the power supply ring.

In order to achieve the above-mentioned objects, there is provided according to the present invention a semiconductor device comprising: a semiconductor element having a plurality of electrode pads; a redistribution substrate mounting the semiconductor device; and a power supply pattern and a ground pattern formed on the redistribution substrate in a surrounding area of the semiconductor element, wherein one of the ground pattern and the power supply pattern has a plurality of convex portions protruding toward the other of the ground pattern and the power supply pattern, and the other of the ground pattern and the power supply pattern has a plurality of concave portions each of which receives the corresponding one of the convex portions with a predetermined distance therebetween.

According to the present invention, since the convex portions protrude into the respective concave portions, a length of a gap formed between the ground patter and the power supply pattern is increased. Thereby, the decoupling capacity between the ground pattern and the power supply pattern increases, and a power supply bounce or a ground bounce caused by a simultaneous switching noise or an external noise can be suppressed. Therefore, the semiconductor device can be prevented from malfunctioning due to the simultaneous switching noise.

Additionally, one of the ground pattern and the power supply pattern closer to the bonding pads of the redistribution substrate includes a shielding portion extending between adjacent ones of the bonding pads. Accordingly, the adjacent ones of the bonding pads are shielded from each other, thereby preventing generation of a cross-talk noise between the adjacent ones of the bonding pads.

Other objects, features and advantages of the present invention will become more apparent from the following detailed description when read in conjunction with the accompanying drawings.

DETAILED DESCRIPTION OF THE PREFERRED EMBODIMENTS

Figure 1:
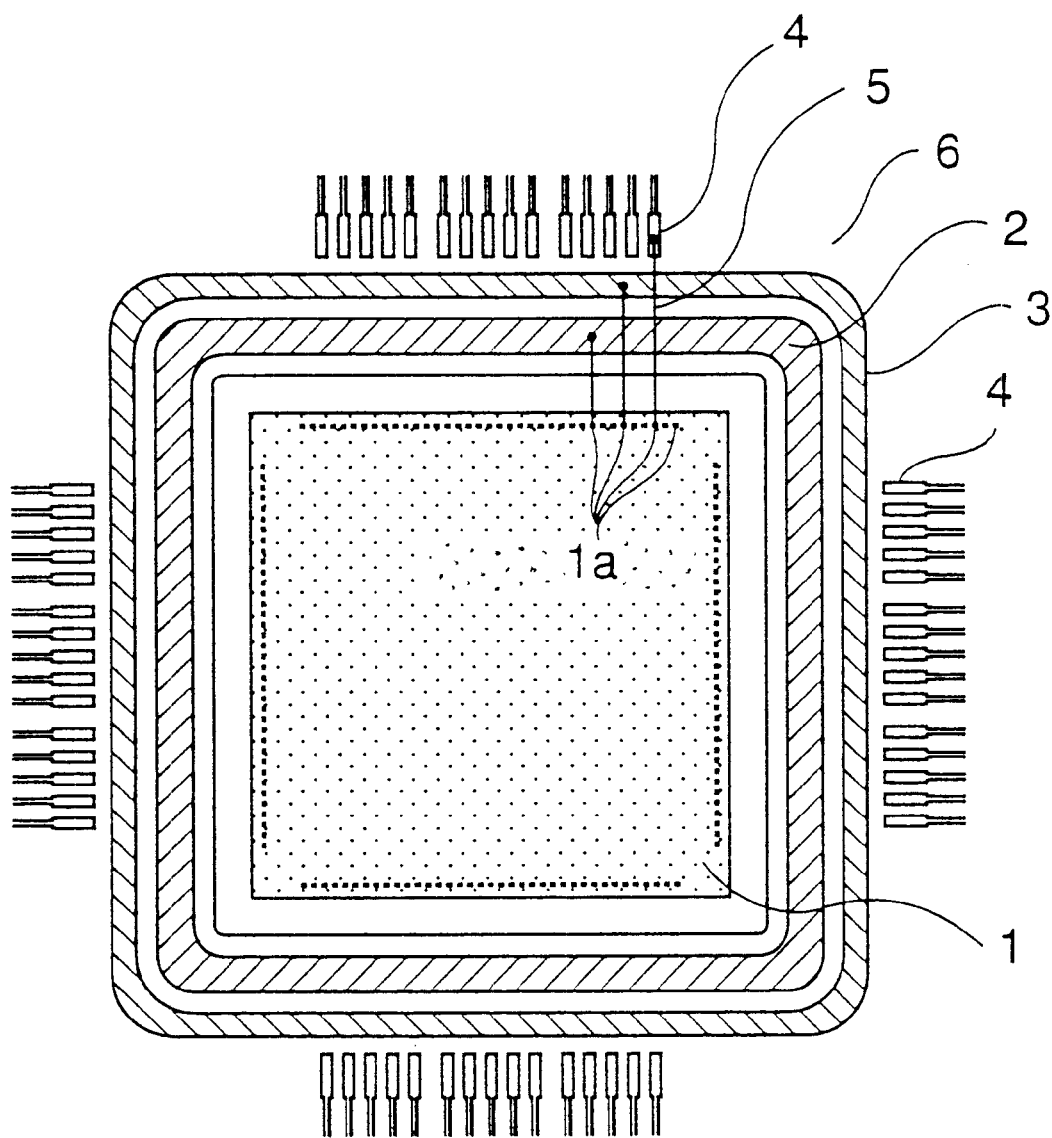
FIG. 1 is a plan view of a ground ring and a power supply ring of a conventional semiconductor device.
Figure 2:
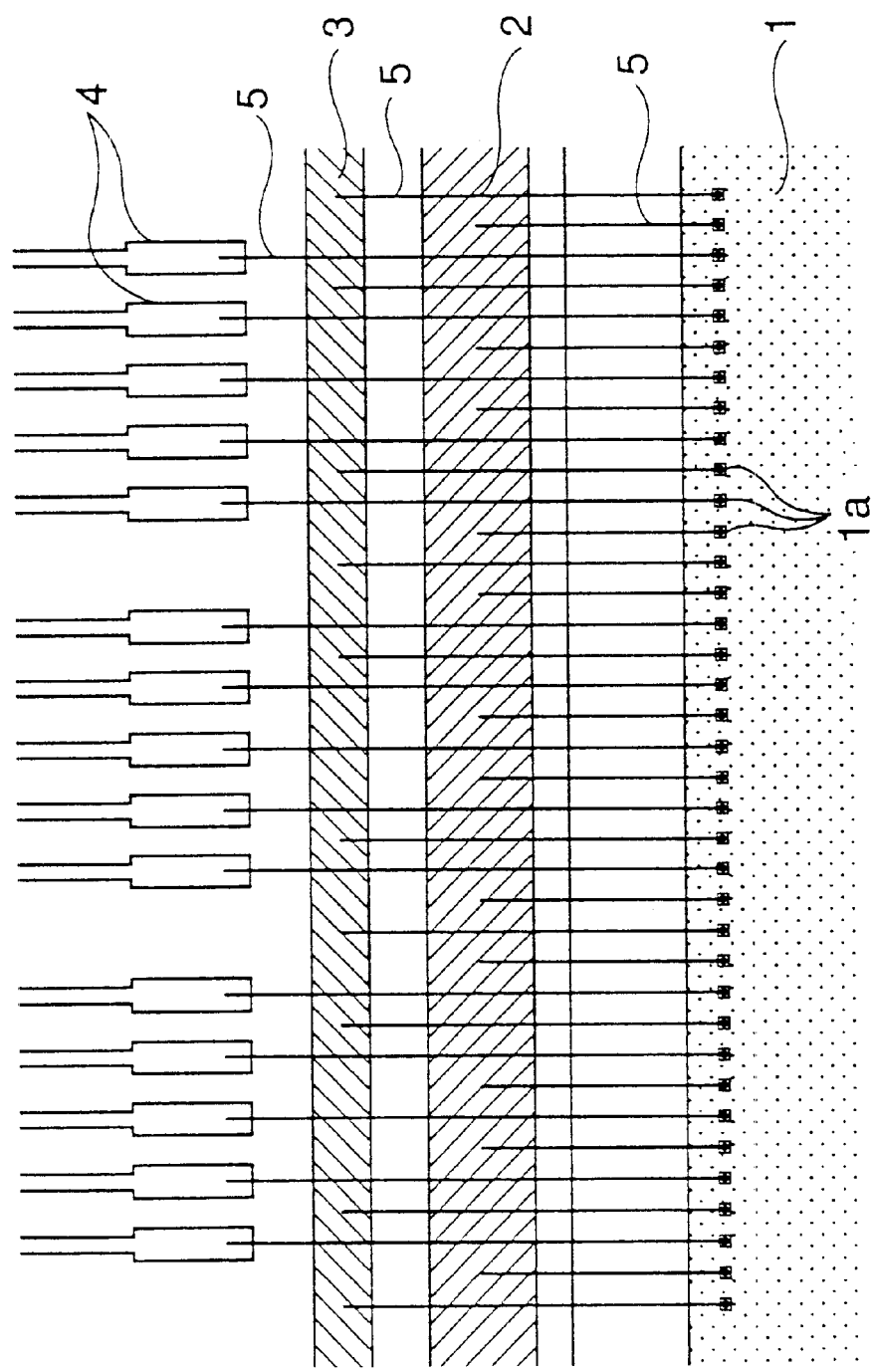
FIG. 2 is an enlarged plan view of a part of the semiconductor device shown in FIG. 1.
Figure 3:
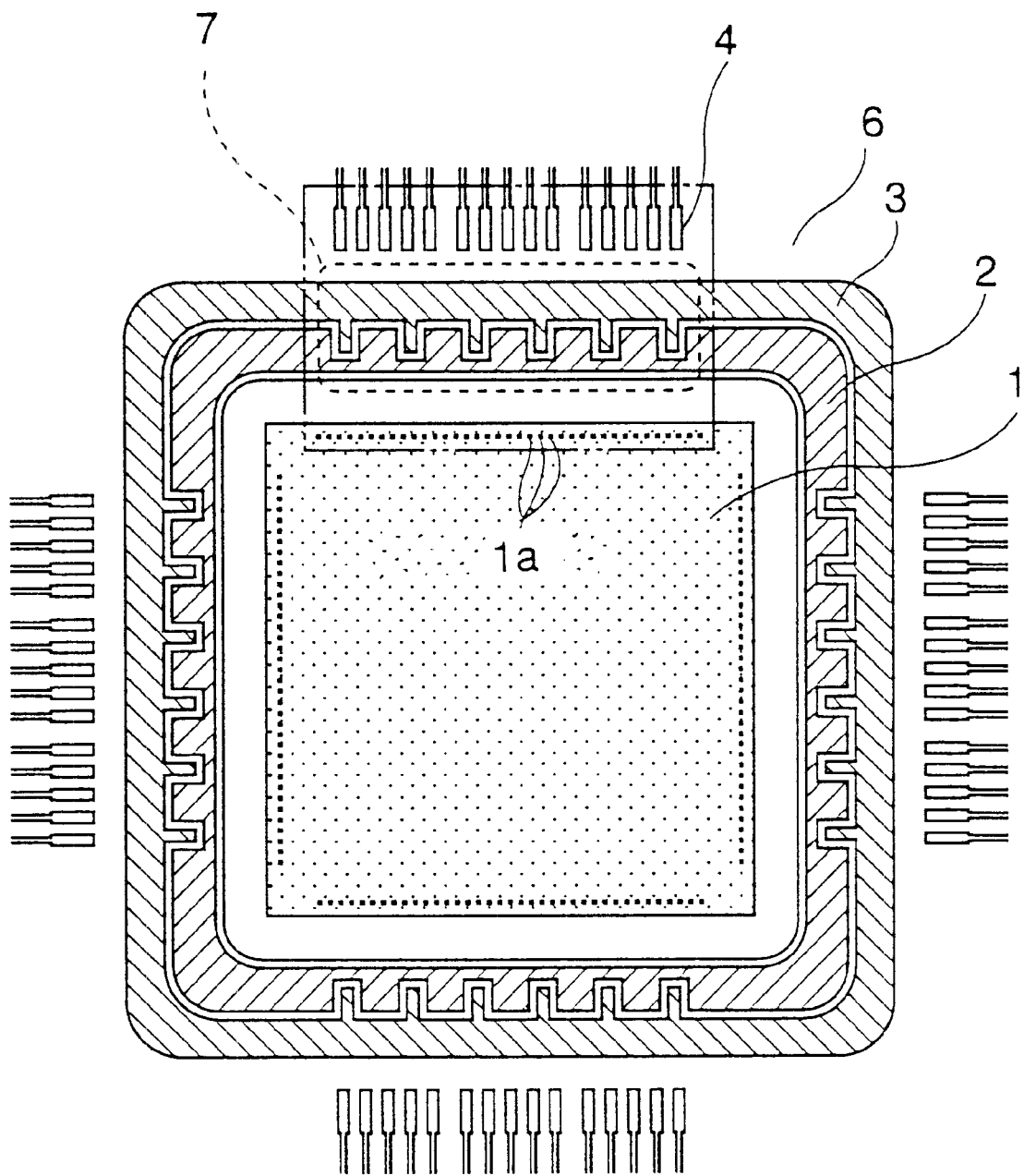
FIG. 3 is a plan view of a ground ring and a power supply ring of a semiconductor device according to a first embodiment of the present invention.

A description will now be given, with reference to FIG. 3, of a first embodiment of the present invention. FIG. 3 is a plan view of a ground ring and a power supply ring of a semiconductor device according to the present invention. In FIG. 3, parts that are the same as the parts shown in FIG. 1 are given the same reference numerals, and descriptions thereof will be omitted.

In the semiconductor device shown in FIG. 3, the semiconductor element 1 is provided on an interposer 6 (redistribution layer). A ground ring 2 is formed on the interposer 6 so as to surround the semiconductor element 1. Additionally, a power supply ring 3 is formed on the interposer 6 so as to surround the ground ring 2 with a predetermined distance therebetween. A plurality of bonding pads 4 are arranged outside of the power supply ring 3.

Semiconductor element 1 has a plurality of electrode pads 1a. Some electrode pads 1a are electrically connected to the bonding pads 4 formed on the interposer 6 by the bonding wires 5. Additionally, other electrode pads 1a of the semiconductor element 1 are connected to the ground ring 2 by the bonding wires 5 so as to be grounded. Additionally, other electrode pads 1a of the semiconductor element 1 are connected to the power supply ring 3 by bonding wires 5 so that an electric power is supplied to the semiconductor element 1.

In the semiconductor device shown in FIG. 3, the electrode pads 1a are arranged along the four sides of the semiconductor element 1. Each of the ground ring 2 and the power supply ring 3 is formed as a square belt shape so as to encircle the semiconductor element 1. A predetermined gap or space (10 $\mu$m–150 $\mu$m) is provided between the ground ring 2 and the power supply ring 3. In the present embodiment, a plurality of convex portions 3a are formed along a side of the power supply ring 3, which side faces the ground ring 2. Each of the convex portions 3a protrudes toward the ground ring 2. A plurality of concave portions 2a are formed in the ground ring 2 so as to receive the respective convex portions 3a of the power supply ring 3. A predetermined gap or space (10 $\mu$m–150 $\mu$m) is provided between each of the concave portions 2a of the ground ring 2 and the respective one of the convex portions 3a of the power supply ring 3. Accordingly, a comb-shaped portion 7 is formed, as indicated by an area encircled by a dotted line in FIG. 3, in an area where the ground ring 2 and the power supply ring 3 face to each other.

The formation of the comb-shaped portion 7 increases a length of each of the opposing sides of the ground ring 2 and the power supply ring 3. That is, the length of each of the opposing sides of the ground ring 2 and the power supply ring 3 is increased by the length of the gap or space between the convex portions 3a of the power supply ring 3 and the respective concave portions 2a of the ground ring 2. Accordingly, the decoupling capacity between the ground ring 2 and the power supply ring 3 increases, thereby strengthening an electric coupling between the ground ring 2 and the power supply ring 3. Therefore, a power supply bounce and a ground bounce caused by the simultaneous switching noise or the external noise can be suppressed, which prevents the semiconductor device from malfunctioning.

Figure 4:
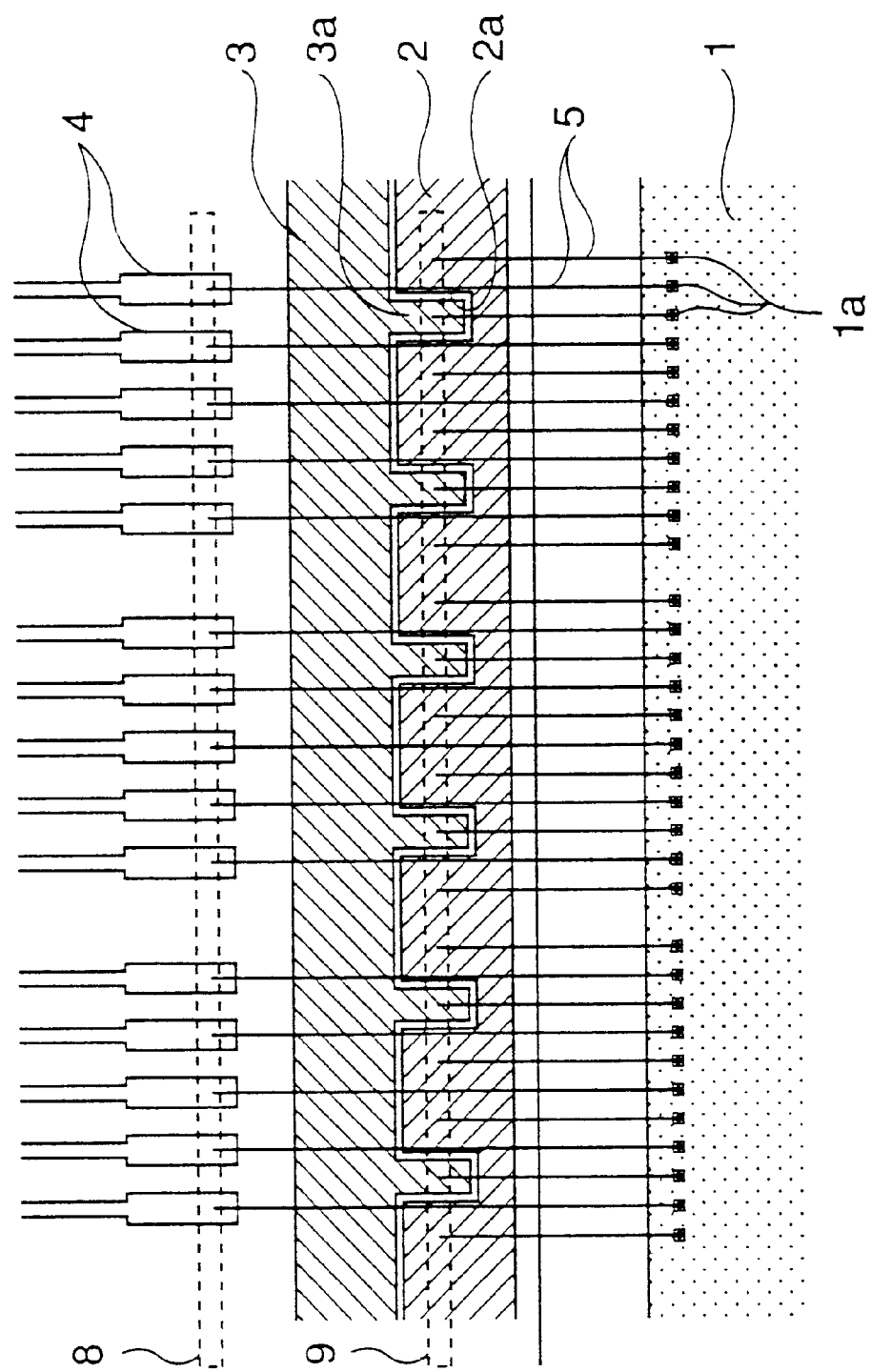
FIG. 4 is an enlarged plan view of a part of the semiconductor device shown in FIG. 3.

FIG. 4 is an enlarged view of a part encircled by a single dashed chain line in FIG. 3. As shown in FIG. 4, each of the bonding pads 4 is connected to the respective one of the electrode pads 1a of the semiconductor element 1 by the respective one of the bonding wires 5 (metal wire). Similarly, predetermined ones of the electrode pads 1a of the semiconductor element 1 are connected to the respective convex portions 3a of the power supply ring 3 by the respective bonding wires 5. For instance, a voltage of 3V is supplied to the power supply ring 3. The power supply voltage (for instance, 3V) is supplied to the predetermined ones of the electrode pads 1a of the semiconductor element 1 from the power supply ring 3 through the bonding wires 5. Similarly, other ones of the electrode pads 1a of the semiconductor element 1 are connected to the ground ring 2 by the respective bonding wires 5. Since the ground ring 2 is connected to the ground line, the electrode pads 1a connected to the ground ring 2 are grounded.

In the above-mentioned structure, an end of each of the bonding wires 5 is connected to the respective one of the convex portions 3a of the power supply ring 3. Thereby, a distance between each of the electrode pads 1a of the semiconductor element 1 and a connecting position of the respective one of the concave portions 2a of the ground ring 2 at which one of the bonding wires 5 is connected can be equal to a distance between each of the electrode pads 1a of the semiconductor element 1 and a connecting position of the respective one of the convex portions 3a of the power supply ring 3 at which one of the bonding wires 5 is connected. That is, the connecting positions of the ground ring 2 and the connecting positions of the power supply ring 3 can be arranged along a line extending in a direction of alignment of the bonding pads 4. In this case, two lines are formed by the ends of the bonding wires 5. One line is formed by the ends of the bonding wires which ends are connected to the respective bonding pads 4, as indicated by dotted lines 8 in FIG. 4. The other line is formed by the ends of the bonding wire 5 which ends are connected to the ground ring 2 or the power supply ring 3, as indicated by dotted lines 9 in FIG. 4.

According to the above-mentioned structure, a large distance can be maintained between the connecting points of the bonding wires 5 at the ground ring 2 and the power supply ring 3 and connecting points of the bonding wires 5 at the bonding pads 4. Thereby, the adjacent ones of the bonding wires 5 are prevented from contacting each other.

Figure 5:
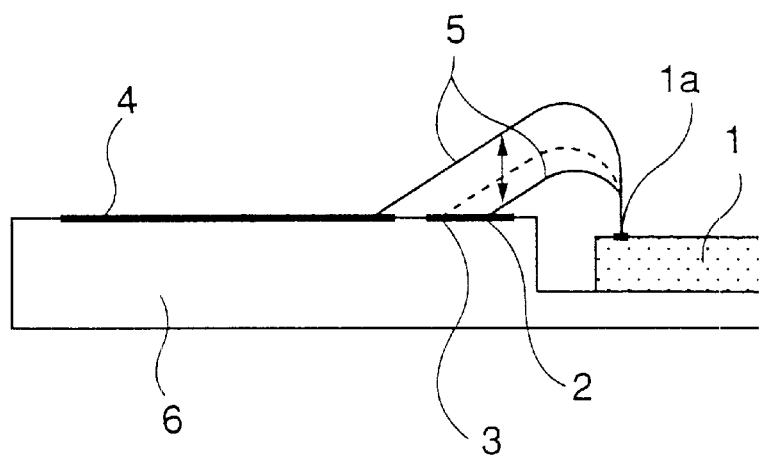
FIG. 5 is a side view of the semiconductor device shown in FIG. 3.

FIG. 5 is a side view of the bonding wires in a case in which the connecting points of the bonding wires 5 are arranged in two rows. In FIG. 5, the bonding wires in a case in which the connecting points form three rows as is in the conventional semiconductor device is shown by a dotted line. When the connecting points of the bonding wires 5 are arranged in two rows, the distance between the rows of the connecting points can be larger than that of the case in which the connecting points of the bonding wires are arranged in three rows. Thus, the distance of the adjacent ones of the bonding wires 5 measured in a vertical direction can be increased as shown in FIG. 5 than the case in which the connecting points form three rows. Accordingly, a problem in which adjacent ones of the bonding wires 5 contact to each other due to a small distance therebetween can be prevented.

Figure 6:
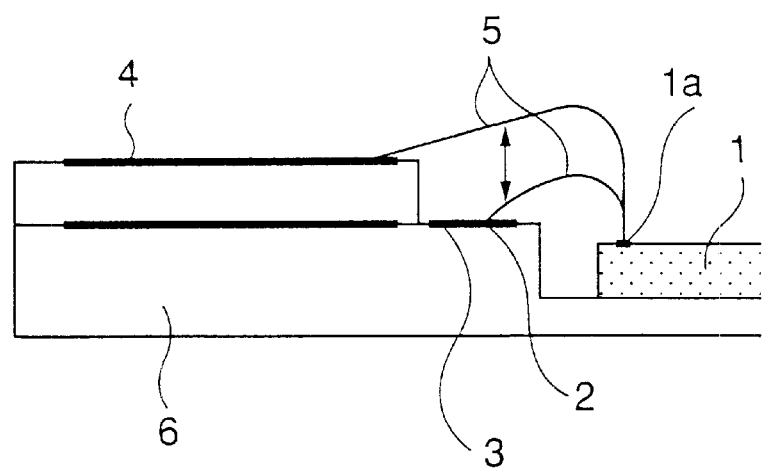
FIG. 6 is a side view of a variation of the semiconductor device shown in FIG. 3.

FIG. 6 is a side view of a variation of the semiconductor device according to the present embodiment. In the variation shown in FIG. 6, the interposer 6 has a layered structure. The ground ring 2 and the power supply ring 3 are formed in a lower layer than a layer where bonding pads 4 are formed. Therefore, the distance (show by the arrow in the figure) in the vertical direction between the bonding wires 5 connected to the bonding pads 4 and the bonding wires 5 connected to wither the ground ring 2 or the power supply ring 3 can be increased enlarged further than that shown in FIG. 5. Therefore, the problem of the distance in the vertical direction of the adjacent ones of the bonding wires 5 being small and being put in contact can surely be prevented.

Figure 7:
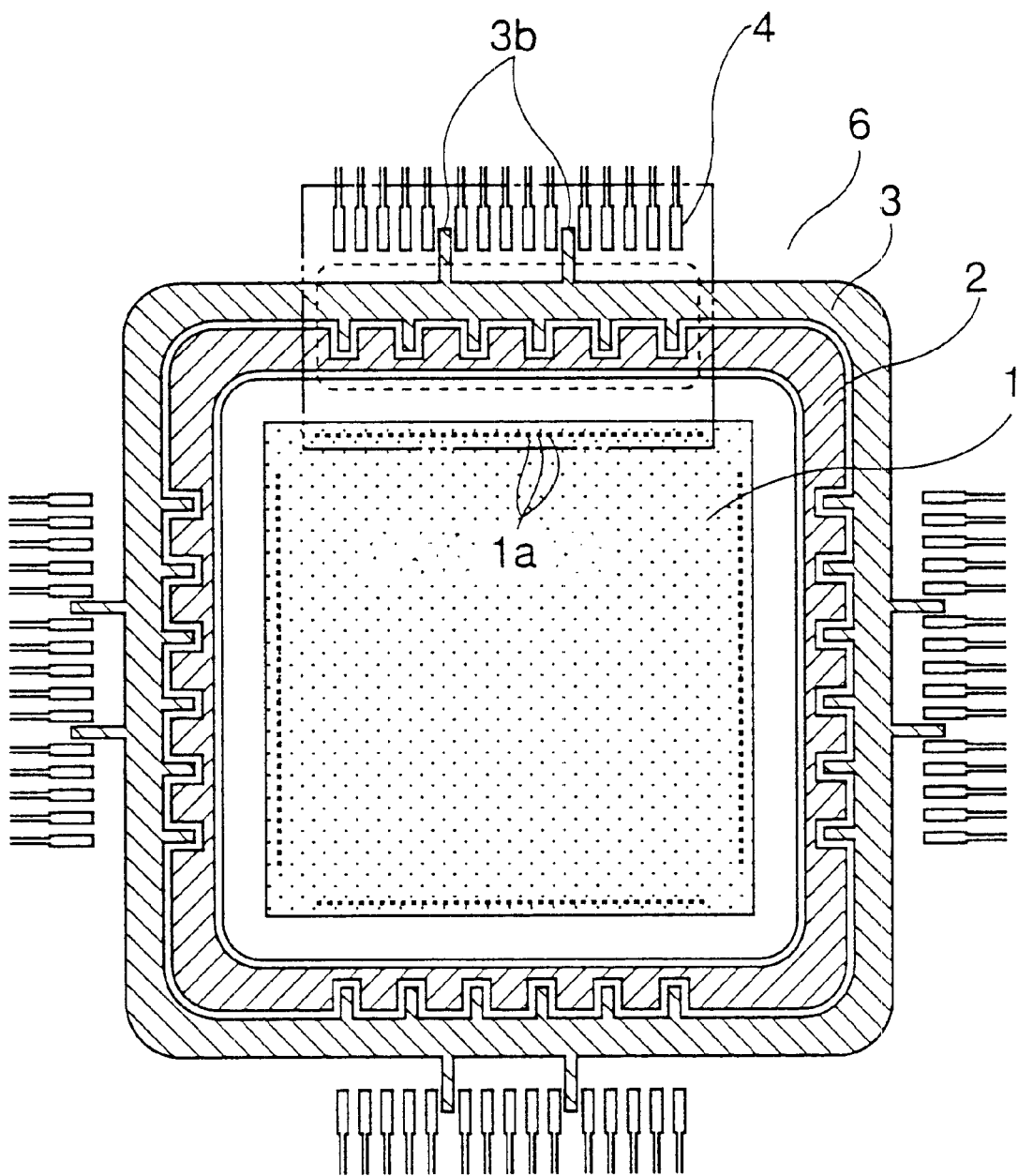
FIG. 7 is a plan view of a ground ring and a power supply ring of a semiconductor device according to a second embodiment of the present invention.

A description will now be given, with reference to FIG. 7, of a second embodiment of the preset invention. FIG. 7 is a plan view of a ground ring and a power supply ring provided in a semiconductor device according to the second embodiment of the present invention. In FIG. 7, parts that are the same as the parts shown in FIG.3 are given the same reference numerals, and descriptions thereof will be omitted.

The semiconductor according to the second embodiment of the present invention has basically the same structure as the first embodiment except for a shielding portion 3b extending between adjacent ones of the bonding pads. That is, as shown in FIG. 7, the power supply ring 3 is provided with the shielding portions 3b each of which extends between the adjacent ones of the bonding pads.

Figure 8:
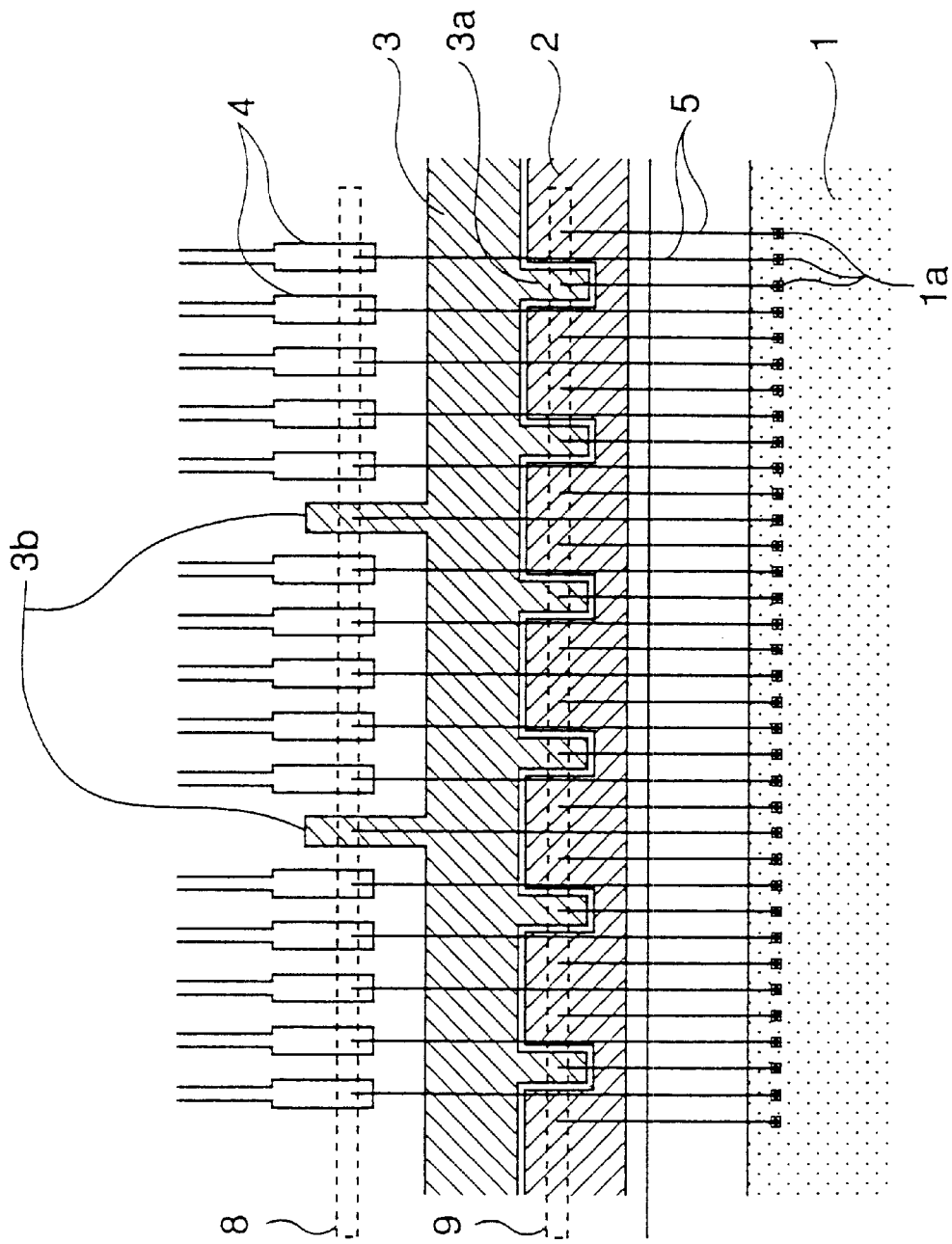
FIG. 8 is an enlarged plan view of a part of the semiconductor device shown in FIG. 7.

FIG. 8 is an enlarged view of a part enclosed by a single dashed chain line in FIG. 7. As shown in FIG. 8, each of the shielding portions 3b extends beyond a line formed by the contact points at which the bonding wires 5 are connected. The contact points of the bonding wires 5 serve as discontinuous points having a large impedance, which tends to reflect an electric signal and generates the cross-talk noise. In the present embodiment, the shielding portions 3b are provided between the connection points at which a cross-talk noise tends to be generated between the bonding pads 4. Thereby, the connection points are shielded by the shielding portions 3b, and the generation of the cross-talk noise is prevented. Accordingly, in the semiconductor device according to the present embodiment, an erroneous operation due to the cross-talk between the bonding pads can be prevented.

Additionally, in the present embodiment, the connection of the bonding wires 5 to the power supply ring 3 may be made with the convex portions 3a of the power supply ring 3 as in the above-mentioned first embodiment, or, alternatively, the connection may be made with the shielding portions 3b. When the bonding wires 5 are connected to the shielding portions 3b, the two-line connection can be maintained by connecting the bonding wires 5 along a line formed by the connection points of the bonding pads 4.

Figure 9:
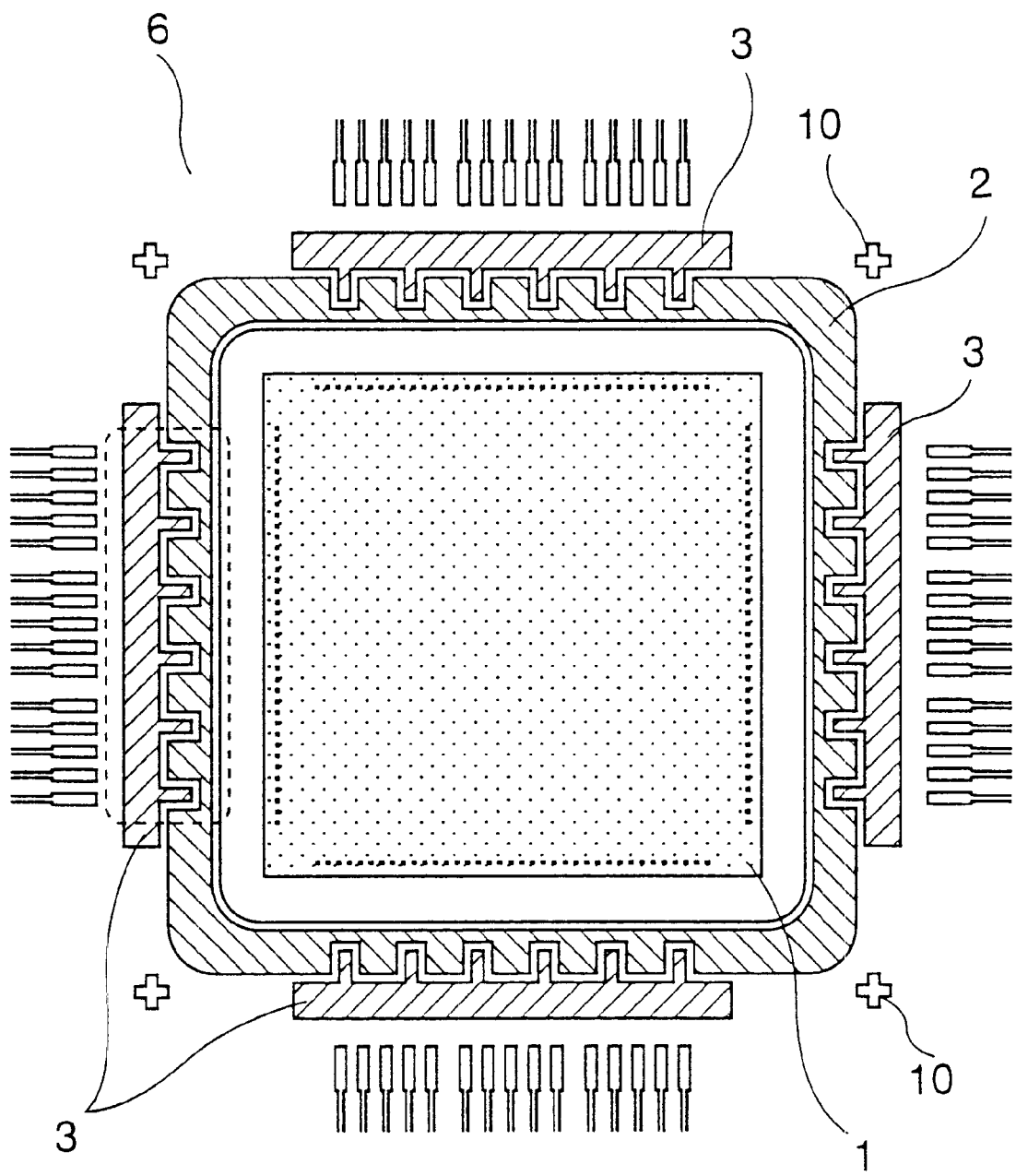
FIG. 9 is a plan view of an example of a ground ring and a power supply ring of a semiconductor device according to a third embodiment of the present invention.
Figure 10:
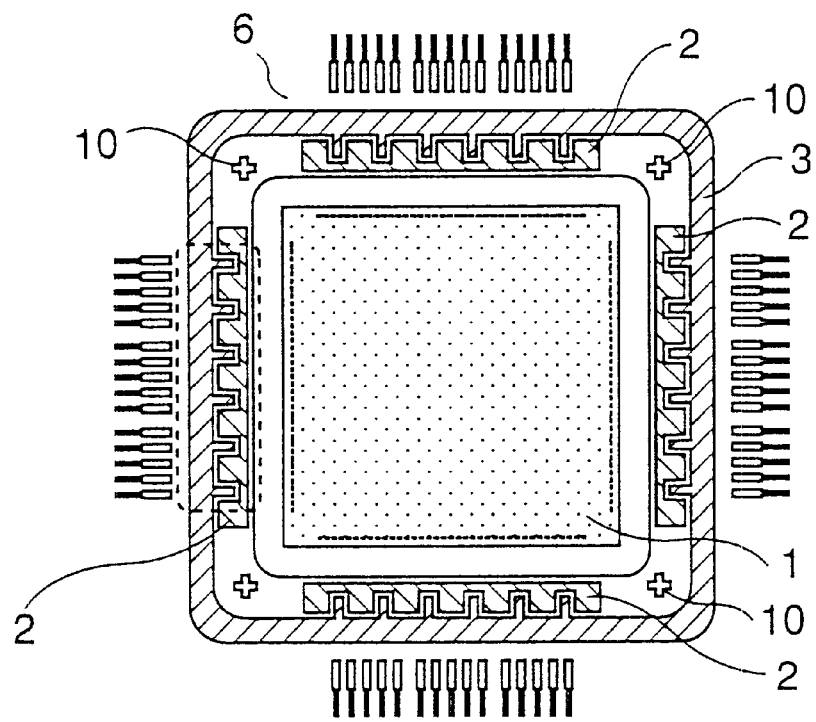
FIG. 10 is a plan view of another example of the ground ring and the power supply ring of the semiconductor device according to the third embodiment of the present invention.

A description will now be given, with reference to FIGS. 9 and 10, of a third embodiment of the present invention. FIGS. 9 and 10 are plan views of a ground ring and a power supply ring provided in a semiconductor device according to the third embodiment of the present invention. In FIGS. 9 and 10, parts that are the same as the parts shown in FIG. 3 are given the same reference numerals, and descriptions thereof will be omitted.

The semiconductor device according to the present embodiment has basically the same structure as the semiconductor device according to the first embodiment of the present invention except for a portion of the ground ring or the power supply ring being cut out.

In the semiconductor device shown in FIG. 9, four corners of the square shaped power supply ring 3 are removed so that the power source ring 3 is divided into four separate portions. Areas corresponding to the removed portions of the power supply ring 3 are provided with recognition marks 10 that are used as references in positioning when connecting the bonding wires 5. The power supply ring 3 does not always have a continuous ring or belt shape. That is, a portion of the power supply ring 3 may be removed, or may be divided into a plurality of separate portions.

Similarly, in the semiconductor device shown in FIG. 10, four corners of the square shaped ground ring 2 are removed so that the ground ring 2 is divided into four separate portions. Areas corresponding to the removed portions of the ground ring 2 are provided with the recognition marks 10 that are used as references in positioning when connecting the bonding wires 5. The ground ring 2 does not always have a continuous ring or belt shape. That is, a portion of the ground ring 2 may be removed, or may be divided into a plurality of separate portions.

The present invention is not limited to the structure in which the power supply ring 3 is provided around the ground ring 2 as is in above mentioned embodiments, and the power supply ring 3 may be provided around the semiconductor element 1 and the ground ring may be provided around the power supply ring 3. In such as case, the comb-like portion 7 can be formed by providing the convex portions to the ground ring 2 and providing the concave portions to the power supply ring 3.

Additionally, the shielding portions 3b shown in FIG. 7 may be provided to the ground ring 2.

Figure 11:
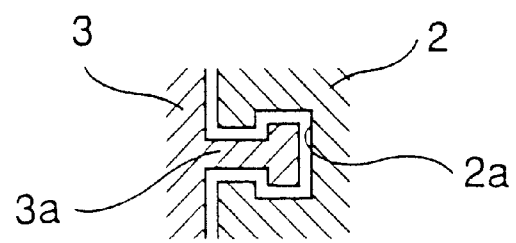
FIG. 11 is plan view of a variation of a protrusion of the power supply ring.

Additionally, the present invention is not limited to the structure in which each of the convex portions 3a of the power ring 3 has a rectangular shape, and each of the convex portions 3a may be in various shapes. For instance, as shown in FIG. 11, the decoupling capacity can be made larger by making the length of the space between the ground ring 2 and the power supply ring 3 longer by enlarging the extreme end of each of the convex portions 3a more than the root thereof.

It can be appreciated from the above-mentioned embodiments that the present invention covers a structure in which the power supply ring (power supply pattern) 3 has a first concavo-convex portion and the ground ring (ground pattern) 2 has a second concavo-convex portion, and the first and second concavo-convex portions are engaged with each other with a predetermined distance therebetween.

The present invention is not limited to the specifically disclosed embodiments, and variations and modifications may be made without departing from the present invention.

The present application is based on the Japanese priority application No. 11-348146 filed on Dec. 7, 1999, the entire contents of which are hereby incorporated by reference.

What is claimed is:

1. The semiconductor device comprising:

a semiconductor element having a plurality of electrode pads;

a redistribution substrate mounting the semiconductor device; and a power supply pattern and a ground pattern formed on the redistribution substrate in a surrounding area of said semiconductor element, wherein one of said ground pattern and said power supply pattern has a plurality of convex portions protruding toward the other of said ground pattern and said power supply pattern, and the other of said ground pattern and said power supply pattern has a plurality of concave portions each of which receives the corresponding one of the convex portions with a predetermined distance therebetween, wherein each of said ground pattern and said power supply pattern is configured to encircle said semiconductor element, wherein said redistribution substrate has a plurality of bonding pads, wherein said convex portions and said concave portions are provided between said electrode pads of said semiconductor element and said bonding pads of said redistribution substrate, and wherein one of said ground pattern and said power supply pattern closer to said bonding pads of said redistribution substrate includes a shielding portion extending between adjacent ones of said bonding pads.

2. The semiconductor device comprising:

a semiconductor element having a plurality of electrode pads;

a redistribution substrate mounting the semiconductor device; and a power supply pattern and a ground pattern formed on the redistribution substrate in a surrounding area of said semiconductor element, wherein one of said ground pattern and said power supply pattern has a plurality of convex portions protruding toward the other of said ground pattern and said power supply pattern, and the other of said ground pattern and said power supply pattern has a plurality of concave portions each of which receives the corresponding one of the convex portions with a predetermined distance therebetween, wherein each of said ground pattern and said power supply pattern is configured to encircle said semiconductor element, wherein said redistribution substrate has a plurality of bonding pads, wherein said convex portions and said concave portions are provided between said electrode pads of said semiconductor element and said bonding pads of said redistribution substrate, and wherein said bonding pads of said redistribution substrate are formed on a layer different from a layer on which said ground pattern and said power supply pattern are formed.

3. The semiconductor device comprising:

a semiconductor element having a plurality of electrode pads;

a redistribution substrate mounting the semiconductor device; and a power supply pattern and a ground pattern formed on the redistribution substrate in a surrounding area of said semiconductor element, wherein one of said ground pattern and said power supply pattern has a plurality of convex portions protruding toward the other of said ground pattern and said power supply pattern, and the other of said ground pattern and said power supply pattern has a plurality of concave portions each of which receives the corresponding one of the convex portions with a predetermined distance therebetween, and wherein at least one of said ground pattern and said power supply pattern has a ring shape of which a portion is removed.

4. A semiconductor device comprising:

a semiconductor element having a plurality of electrode pads;

a redistribution substrate mounting the semiconductor device; and a power supply pattern and a ground pattern formed on the redistribution substrate in a surrounding area of said semiconductor element, wherein said power supply pattern has a first concavo-convex portion and said ground pattern has a second concavo-convex portion, said concavo-convex portions having convex portions with extreme ends and roots, said extreme ends being wider than said roots, and said first and second concavo-convex portions are engaged with each other with a predetermined distance therebetween.

* * * * *